(12) United States Patent
Hatta (10) Patent No.: US 6,768,134 B2
(45) Date of Patent: Jul. 27, 2004

(54) SEMICONDUCTOR DEVICE AND A METHOD FOR FORMING PATTERNS

(75) Inventor: Yoshihisa Hatta, Kobe (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/726,831

(22) Filed: Dec. 3, 2003

(65) Prior Publication Data

US 2004/0082123 A1 Apr. 29, 2004

Related U.S. Application Data

(62) Division of application No. 09/861,939, filed on May 21, 2001, now Pat. No. 6,693,000.

(30) Foreign Application Priority Data

May 23, 2000 (JP) ........................................ 2000-151234

(51) Int. Cl.[7] .............................................. H01L 29/04
(52) U.S. Cl. .......................................... 257/59; 438/149
(58) Field of Search ..................................... 257/59, 72

(56) References Cited

U.S. PATENT DOCUMENTS 5,691,782 A  * 11/1997  Nishikawa et al. ........... 394/47
5,981,972 A  * 11/1999  Kawai et al. .................. 257/59
6,107,668 A  *  8/2000  Ukita .......................... 257/412
6,369,410 B1 *  4/2002  Yamazaki et al. ............. 257/72
6,567,150 B1 *  5/2003  Kim ........................... 349/187

FOREIGN PATENT DOCUMENTS

| DE | 19916073 A | 12/1999 | ......... H01L/29/786 |
| WO | WO9206505 | 4/1992 | ......... H01L/29/784 |
| WO | 0115234 A1 | 3/2001 | ........... H01L/29/49 |

OTHER PUBLICATIONS

Patent Abstracts Of Japan, Shimada Yasunori, "Thin Film Transistor And Manufacture Thereof," Publication No. 06085255, Mar. 25, 1994, Application No. 04234977, Feb. 9, 1992.

Japanese Abstract "Manufacture of Thin–Film Field–Effect Transistor Array", 62–84563, Apr. 18, 1987.

Japanese Abstract "Active Matrix Type Liquid Crystal Display Device", 6–242453, Sep. 2, 1994.

* cited by examiner

Primary Examiner—David Nelms
Assistant Examiner—Quoc Hoang (57) ABSTRACT

The invention provides a semiconductor device and a method for forming patterns in which the manufacturing cost is reduced while the step coverage is improved. The ITO film 50 and the MoCr film 100 are dry-etched after having formed the ITO film 50 and the MoCr film 100.

3 Claims, 8 Drawing Sheets

SEMICONDUCTOR DEVICE AND A METHOD FOR FORMING PATTERNS

This is a division of application Ser. No. 09/861,939 filed May 21, 2001 now U.S. Pat. No. 6,693,000.

TECHNICAL FIELD

The invention relates to a semiconductor device comprising a source electrode, a drain electrode and a source bus. The invention also relates to a method of forming patterns of a source electrode, a drain electrode and a source bus.

BACKGROUND OF THE INVENTION

In recent years, TFT (thin film transistor) devices have been commonly used in liquid crystal displays for, for example, notebook personal computers. A TFT is constructed by forming on a substrate, various kinds of films such as metal films and insulation films having various patterns. In order to form the pattern of each of such films, the material for each of the films is first deposited on the substrate. Then, the desired pattern corresponding to each of the films is defined in the deposited material by means of a lithography method. Accordingly, the more the number of the films to be patterned increases, the more the number of the patterning processes using lithography method increases, which may be resulted in the increase of the manufacturing cost.

In order to cope with this kind of problem, it is considered not to perform a method of etching a single film but to perform a method in which, firstly, a double layer is formed by layering two kinds of films, and next, the double layer is continuously etched. According to the latter method, the desired pattern is defined in these two kinds of films by performing only one patterning process.

However, in this method of etching the double layer, another one film must be etched compared with etching a single layer. Thus, a difference in level between an etched portion and a non-etched portion formed in the double layer (i.e., a depth of an etched portion) becomes deep comparing with the single layer. Therefore, if a further film is formed on the etched double layer so as to cover the difference in level of the double layer with the further film, the step coverage of that further film may become worse at the difference in level of the double layer, and as a result the characteristic of the film may be deteriorated. On the other hand, if two kinds of films consisting of the double layer are not continuously etched but separately etched, there is a problem that the manufacturing cost may increase.

In view of the above-described background, it is an objective of the invention to provide a semiconductor device and a method for forming patterns in which the manufacturing cost is reduced while the step coverage is improved.

SUMMARY OF THE INVENTION

In order to achieve the above-described objective, the invention provides a method of forming patterns. Said method is characterised by comprising a step of forming a first metal film on a substrate, a step of forming a second metal film on said first metal film and a step of forming patterns of a source electrode, a drain electrode and a source bus by patterning said second and first metal films, wherein said step of forming the patterns of the source electrode, the drain electrode and the source bus comprises a step of forming a resist coat on said second metal film and a first etching step of dry-etching said second and first metal films after said step of forming said resist coat.

In this method of forming patterns, after having formed the resist coat on the second metal film, not only the second metal film but also the first metal film that is formed below the second metal film could be etched. Therefore, when etching the second and first metal films, there is no need to form a specific resist coat for patterning the second metal film and another specific resist coat for patterning the first metal film. This may be resulted in a reduction of the manufacturing cost.

Besides, in this method of forming patterns, since those metal films are dry-etched, a difference in level between an etched portion and a non-etched portion is formed in the second and first metal films. In this case, even if another film is formed to cover the second and first metal films having that difference in level, a good step coverage of this another film can be obtained at the difference in level (as will be described in detail later).

In particular, in this method of forming patterns, said first metal film is preferably an ITO film mainly including ITO, the second metal film is preferably a molybdenum-chromium film mainly including a molybdenum material, and said first etching step is preferably a step of dry-etching said molybdenum-chromium film and said ITO film with a mixed gas of chlorine and oxygen. By dry-etching the molybdenum-chromium film and the ITO film with a mixed gas of chlorine and oxygen, edge portions of the molybdenum-chromium film and the ITO film could be formed in taper shape.

Besides, said method may comprise, instead of said first etching step, a second etching step of wet-etching said second metal film and then dry-etching said first metal film. Even if this second etching step is provided instead of the first etching step, the manufacturing cost reduction can be still achieved. In the second etching step, a difference in level between an etched portion and a non-etched portion is formed in the second and first metal films. However, a good step coverage at the difference in level can be obtained just as in the case of the first etching step (as will be described in detail later).

In addition, in this inventive method, said first metal film preferably has a thickness not greater than 500 angstrom. By keeping such thickness, a good step coverage can be achieved.

Furthermore, in this inventive method, said first metal film is preferably an ITO film mainly including ITO, the second metal film is preferably a molybdenum-chromium film mainly including a molybdenum material, and said second etching step is preferably a step of wet-etching said molybdenum-chromium film with a mixed etchant of phosphoric acid, nitric acid and water and subsequently dry-etching said ITO film with a gas mainly including chlorine. Through such wet-etching and subsequent dry-etching steps on the molybdenum-chromium film and the ITO film, the edge portions of the molybdenum-chromium film and the ITO film could be formed either substantially perpendicularly or in taper shape relative to the substrate.

Furthermore, said method comprises, instead of said first etching step, a third etching step of wet-etching said second and first metal films and then wet-etching said second metal film further. Even if that third etching step is used instead of the first etching step, the manufacturing cost reduction can be achieved. In the third etching step as well, a difference in level between a etched portion and a non-etched portion may be formed in the second and the first metal films. However, a good step coverage at the difference in level can be obtained. With the third etching step, said first metal film has a thickness not greater than 500 angstrom. By keeping such thickness, the good step coverage can be achieved.

Additionally, in said third etching step, said first metal film is preferably an ITO film mainly including ITO, the second metal film is preferably a molybdenum-chromium film mainly including a molybdenum material, and said third etching step is preferably a step of wet-etching said molybdenum-chromium film with a mixed etchant of phosphoric acid, nitric acid and water, subsequently wet-etching said ITO film with a hydrochloric acid etchant and further wet-etching said molybdenum-chromium film with a mixed etchant of phosphoric acid, nitric acid and water. Through such third etching step of the molybdenum-chromium film and the ITO film, the molybdenum-chromium film and the ITO film could be formed substantially perpendicularly relative to the substrate.

A semiconductor device according to the present invention is characterised by comprising a source electrode formed on a substrate, a source bus formed on said source electrode, a drain electrode that is formed on said substrate and comprises a first electrode and a second electrode formed on said first electrode, and further characterized in that an edge portion of said source electrode protrudes toward said drain electrode relative to an edge portion of said source bus and an edge portion of said first electrode of said drain electrode protrudes toward said source electrode relative to said second electrode.

By applying the above-mentioned method of forming patterns, the edge portion of the source electrode can protrude toward the drain electrode relative to the end of the source bus and the edge portion of the first electrode of the drain electrode can protrude toward the source electrode relative to the edge portion of the second electrode. Such structure means that, for example, in the case of forming an a-Si film that is to be connected to both electrodes of the source and drain electrodes, the a-Si film would be formed in such a way that a good ohmic contact is obtained between each of the source and drain electrodes and the a-Si film.

In the semiconductor device according to the present invention, each edge portion of said source electrode, said source bus, said first electrode and said second electrode may be formed into a surface either which is perpendicular to said substrate or which is inclined relative to said substrate. If using the first etching step according to the present invention, each edge portion of the source electrode, the source bus, the first electrode and the second electrode may be formed into a surface which is inclined relative to the substrate (i.e., taper shape), whereas if using the second or third etching step according to the present invention, each edge portion of the source electrode, the source bus, the first electrode and the second electrode may be formed into a surface which perpendicular to the substrate.

BRIEF DESCRIPTION OF THE DRAWINGS

FIG. 11 is a schematic cross sectional view illustrating a state of having formed the gate insulation film 12 containing the contact hole 12a;

DETAILED DESCRIPTION OF THE INVENTION

Some embodiments of the invention will be below explained in conjunction with a TFT to be mounted within a liquid crystal panel of liquid crystal display devices.

Figure 1:
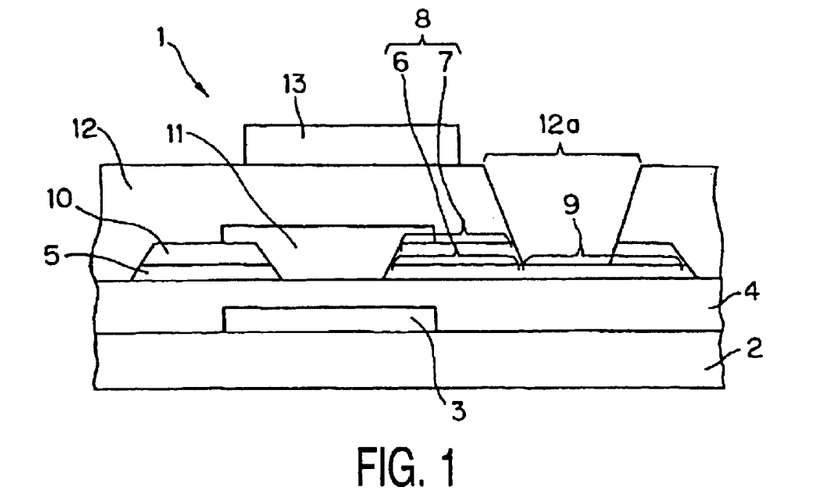
FIG. 1 is a schematic cross section of a TFT 1 that is a first embodiment of a semiconductor device of the invention and is manufactured using a first embodiment of a method of forming patterns of the invention.

FIG. 1 is a schematic cross section of a TFT 1 that is a first embodiment of a semiconductor device of the invention and is manufactured using a first embodiment of a method of forming patterns of the invention.

FIG. 1 illustrates a TFT 1 that is formed on a glass substrate 2. Although many of such TFT 1 could be formed on the glass substrate 2, only one TFT 1 is shown herein for the illustration purpose. Hereinafter, the TFT 1 will be explained referring to FIG. 1 as well as FIG. 2 to FIG. 14 that schematically illustrate a method for producing the TFT 1.

Figure 2:
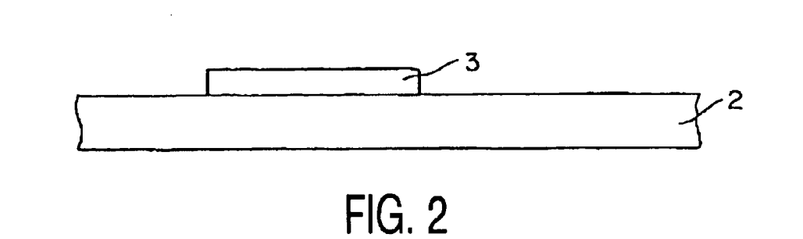
FIG. 2 is a schematic cross sectional view illustrating a state of having formed the light shield film 3 on the glass substrate 2.

In order to produce the TFT 1, a pattern of a light shield film 3 is firstly formed on the glass substrate 2 as illustrated in FIG. 2. The light shield film 3 is formed so as to, firstly, deposit a MoCr (molybdenum-chromium) material for the light shield film 3 on the glass substrate 2, and next define a desired pattern in the deposited MoCr by lithography method.

Figure 3:
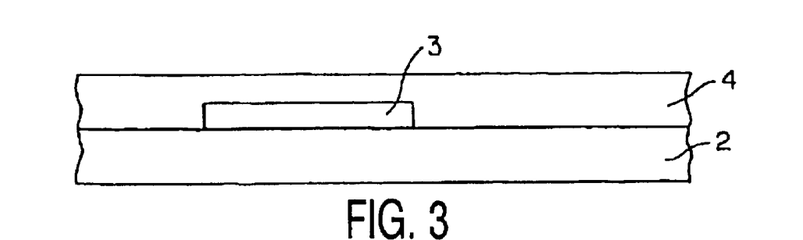
FIG. 3 is a schematic cross sectional view illustrating a state of having formed the SiO₂ layer 4.
Figure 4:
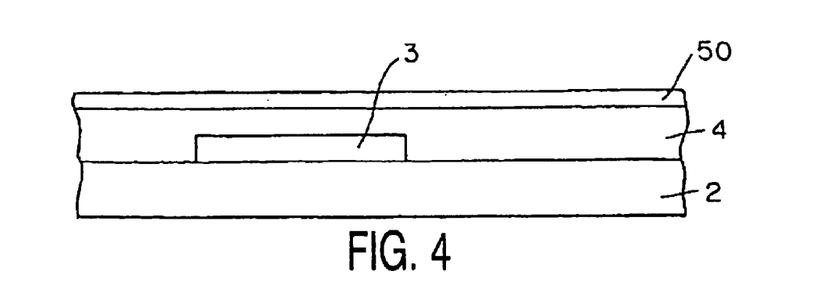
FIG. 4 is a schematic cross sectional view illustrating a state of having formed the ITO film 50.
Figure 5:
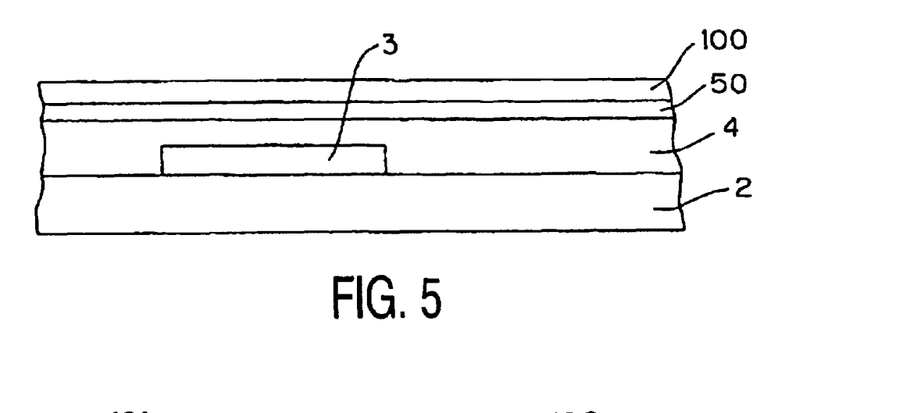
FIG. 5 is a schematic cross sectional view illustrating a state of having formed the MoCr film 100.

Once the light shield film 3 has been formed, an $SiO_2$ layer 4 is formed so as to cover the light shield film 3 as illustrated in FIG. 3, and then an ITO film 50 is formed on the $SiO_2$ layer 4 as illustrated in FIG. 4. It should be noted that as illustrated in FIG. 1, each of a source electrode 5 and a pixel electrode 9 is a single layer whereas a drain electrode 8 is a double layer being consisted of an upper electrode 7 and a lower electrode 6. The ITO film 50 is a film for forming the source electrode 5, the pixel electrode 9 and the lower electrode 6 of the drain electrode 8 by means of an etching step (explained later). In this example, the ITO film 50 is about 400 angstrom thick.

Figure 6:
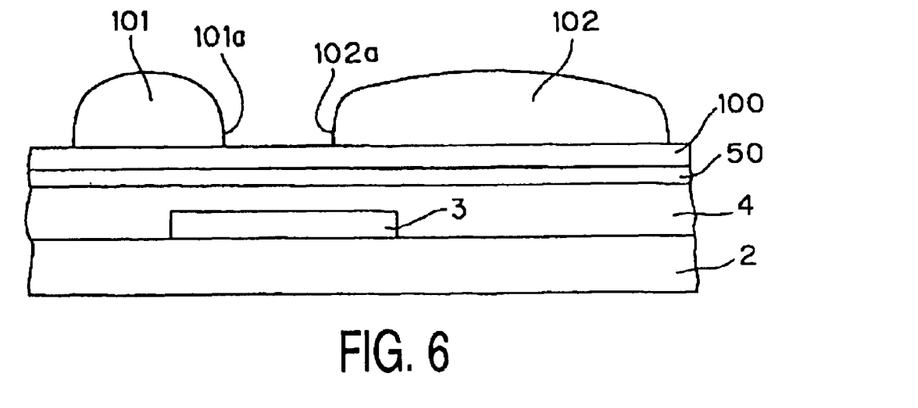
FIG. 6 is a schematic cross sectional view illustrating a state of having formed the resist coats 101 and 102 on the MoCr film 100.

After the ITO film 50 has been formed, a molybdenum-chromium film 100 is further formed on the ITO film 50, as illustrated in FIG. 6, without performing the patterning of the ITO film 50. The molybdenum-chromium film 100 is a film for forming a source bus 10 (see FIG. 1) and the upper electrode 7 of the drain electrode 8 by means of an etching step (explained later). After having formed the ITO film 50 and the MoCr film 100, these two films are continuously etched.

FIG. 6 to FIG. 9 illustrate how to etch the MoCr film 100 and the ITO film 50. Firstly, resist coats 101 and 102 are formed on the MoCr film 100 as illustrated in FIG. 6. Then, a mixed gas of $Cl_2/O_2$ is used to dry-etch the MoCr film 100 and the ITO film 50 by means of a RIE (reactive ion etching) method.

Figure 7:
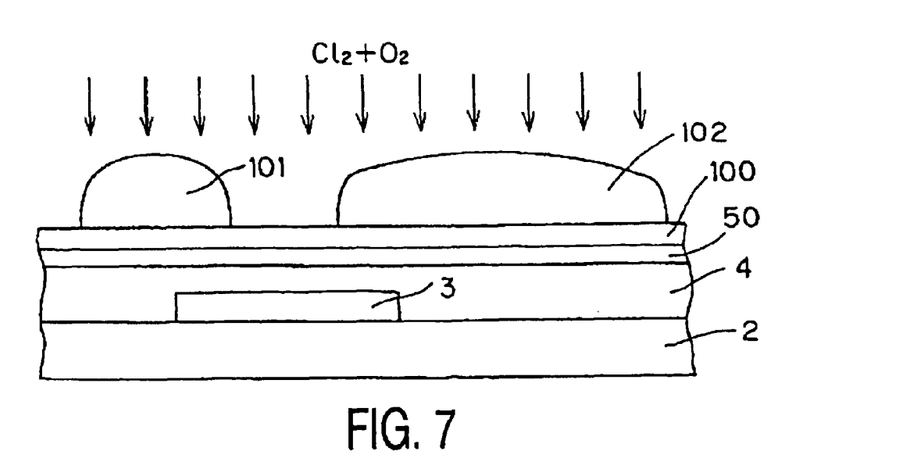
FIG. 7 is a schematic cross sectional view of the MoCr film 100 and the ITO 50 just before the dry-etching step.
Figure 8:
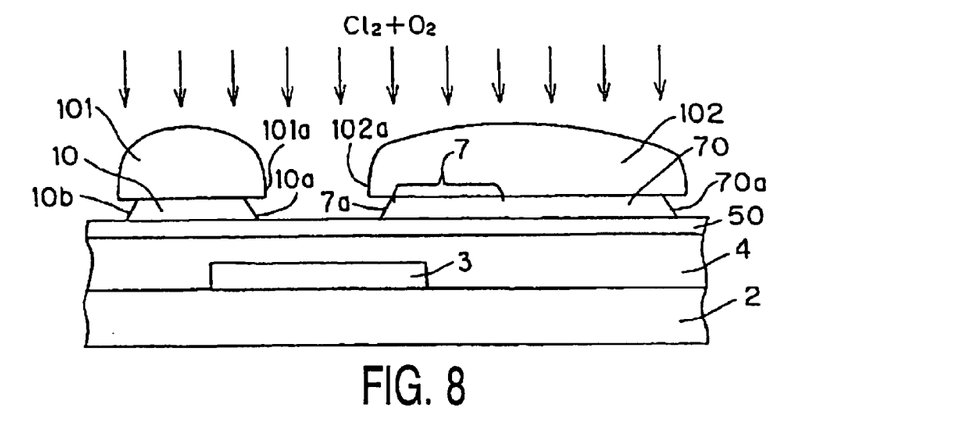
FIG. 8 is a schematic cross sectional view illustrating a state of having dry-etched the MoCr film 100.
Figure 9:
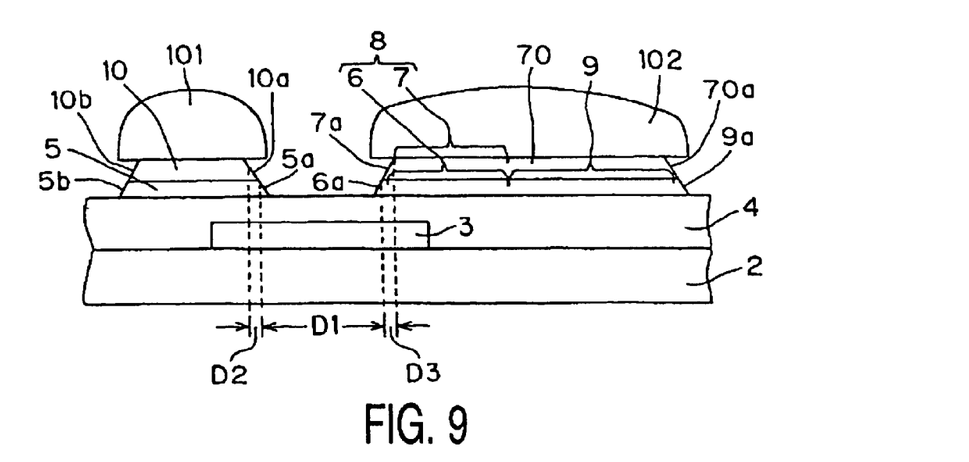
FIG. 9 is a schematic cross sectional view illustrating a state of having dry-etched both the MoCr film 100 and the ITO 50.

FIG. 7 illustrates the state of the MoCr film 100 and the ITO film 50 just prior to the dry-etching step, FIG. 8 illustrates the state of having dry-etched the MoCr film 100, and FIG. 9 illustrates the state of having dry-etched both the MoCr film 100 and the ITO film 50.

By introducing a mixed gas of $Cl_2/O_2$ (a mixture ratio of $Cl_2/O_2$ is about 4:6 to 6:4) as illustrated in FIG. 7, the MoCr film 100 can be first etched as illustrated in FIG. 8, and as a result a pattern of the source bus 10 can be formed immediately below the left-sided resist coat 101 and a pattern of a metal layer 70 can be formed immediately below the right-sided resist coat 102. A portion of the metal layer 70 constructs the upper electrode 7 of the drain electrode 8. The material of the metal layer 70 is the same MoCr as for the source bus 10. By etching the MoCr film 100 using the mixed gas of $Cl_2/O_2$, edge portions 10a and 10b of the source bus 10, an edge portion 7a of the upper electrode 7 and an edge portion 70a of the metal layer 70 can be easily formed in taper shape tilted slantwise against the substrate 2.

After finishing to etch the MoCr film 100, the mixture ratio of $Cl_2/O_2$ should be changed to about 1:1 to 1:0.5 and subsequently the ITO film 50 is dry-etched. As a result, as illustrated in FIG. 9, a pattern of the source electrode 5 can be formed just below the source bus 10 while patterns of the pixel electrode 9 and the lower electrode 6 of the drain electrode 8 can be formed just below the metal layer 70. By etching the ITO film 50 as just described above, the drain electrode 8 consisting of the upper electrode 7 and the lower electrode 6 can be formed. By etching the ITO film 50 using the mixed gas of $Cl_2/O_2$, edge portions 5a and 5b of the source electrode 5, an edge portion 6a of the lower electrode 6 and an edge portion 9a of the pixel electrode 9 can be easily formed in taper shape. It should be noted that through the etching step on the ITO 50, the edge portion 5a of the source electrode 5 could protrude relative to the edge portion 10a of the source bus 10 toward the lower electrode 6 by a distance D2, and the edge portion 6a of the lower electrode 6 could protrude relative to the edge portion 7a of the upper electrode 7 toward the source electrode 5 by a distance D3. In this example, the distance D1 between the edge portion 5a of the source electrode 5 and the edge portion 6a of the lower electrode 6 is about 5 micro-millimeters and each of the distances D2 and D3 is about 1.0 micro-millimeters.

Although the RIE method is used to etch the MoCr film 100 and the ITO film 50 in the above-described example, any other etching method such as a high density PE (plasma etching) may be alternatively used to etch the MoCr film 100 and the ITO film 50.

Figure 10:
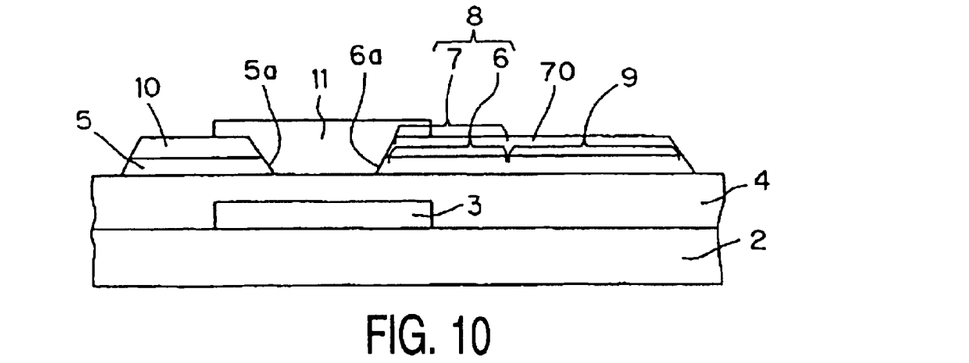
FIG. 10 is a schematic cross sectional view illustrating a state of having formed the island pattern of the a-Si film 11.

After having etched the MoCr film 100 and the ITO film 50 as described above, the resist coat 101 and 102 is removed and then a material of a-Si is deposited. Thereafter, as illustrated in FIG. 10, an island pattern of a-Si film 11 can be formed by defining the desired pattern in the deposited a-Si by means of a lithography method.

Figure 11:
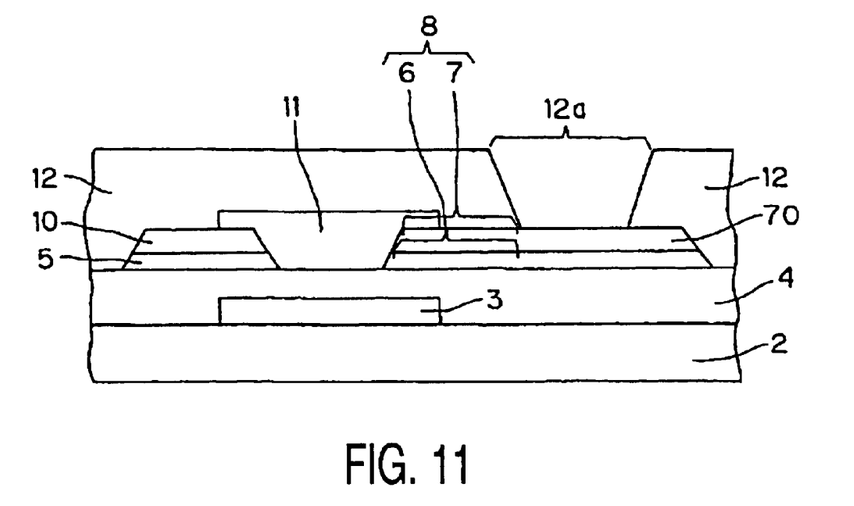
Figure 12:
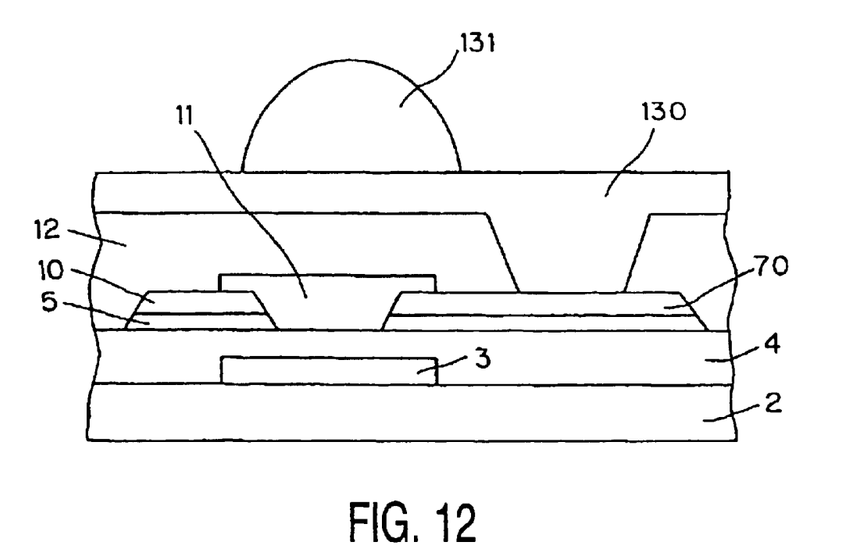
FIG. 12 is a schematic cross sectional view illustrating a state of having formed the Al film 130 and the resist coat 131.

After having formed the a-Si film 11, a gate insulation film 12 having a contact hole 12a is formed as illustrated in FIG. 11. The gate insulation film 12 can be formed by depositing SiNx that is a material for the gate insulation film 12, and then etching the deposited SiNx so that a portion of the metal layer 70 may be exposed. The contact hole 12a is to be used for electrically connecting with any other TFT. After having formed the gate insulation film 12, an Al film 130 is formed, as illustrated in FIG. 12, by deposing aluminum that is a material for the gate electrode 13 (see FIG. 1). A resist coat 131 is then formed so as to pattern on the Al film 130. After forming the resist coat 131, the Al film 130 is wet-etched using a mixed etchant of phosphoric acid, nitric acid and water.

Figure 13:
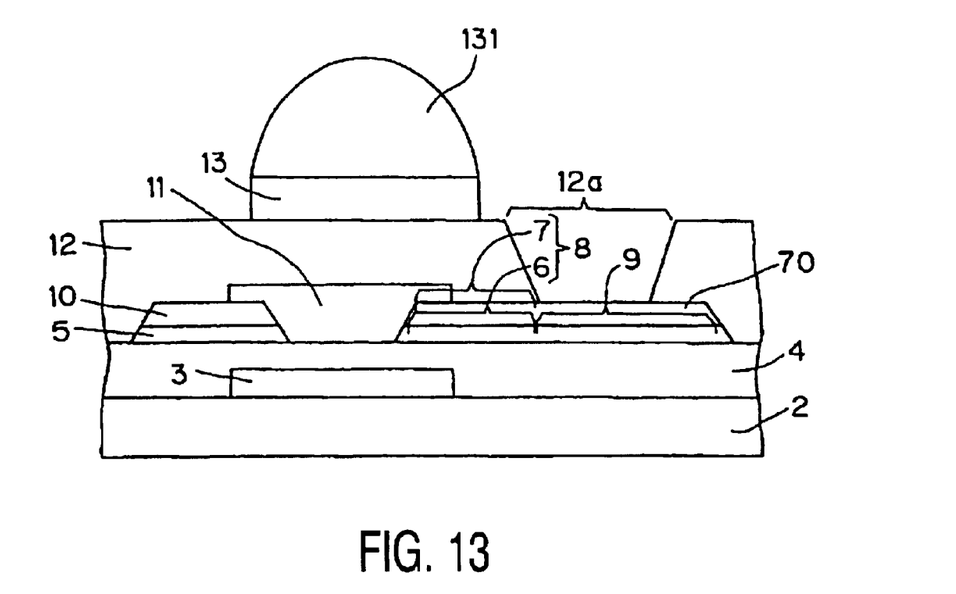
FIG. 13 is a schematic cross sectional view illustrating a state of having just finished to etch the Al film 130.

FIG. 13 illustrates the state of the Al film 130 just after the etching step. By etching the Al film 130, the gate electrode 13 is formed just below the resist coat 131, and, at the same time, the metal layer 70 can be exposed because the aluminum that have been filled in the contact hole 12a can be also etched. The wet-etching step is continued after the metal layer 70 is exposed. The metal layer 70 including MoCr could be etched with the mixed etchant of phosphoric acid, nitric acid and water since the mixed etchant has an etching function on MoCr as well as Al.

Figure 14:
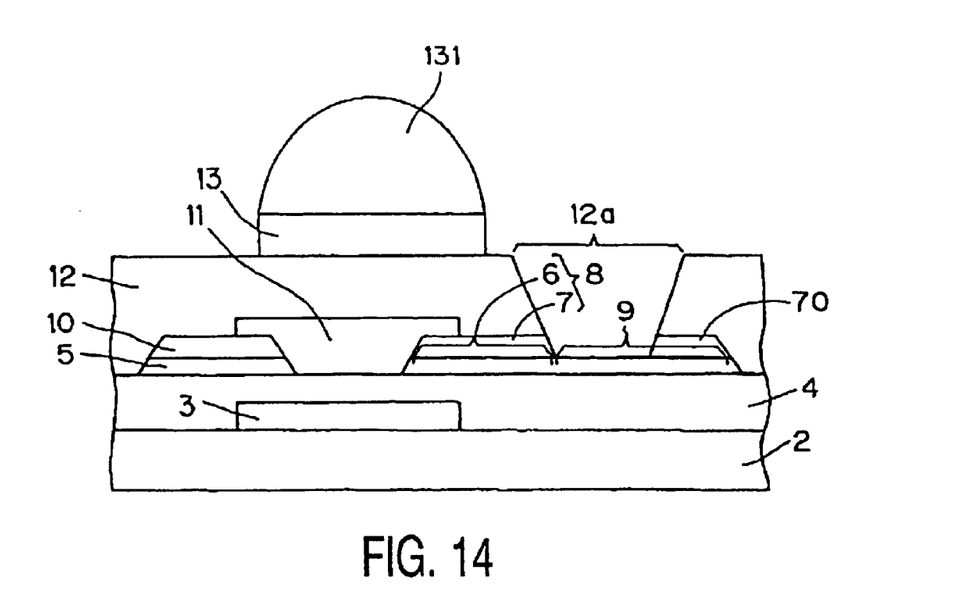
FIG. 14 is a schematic cross sectional view illustrating that a portion of the pixel electrode corresponding to the contact hole 12a has been exposed.

FIG. 14 illustrates the state of the metal layer 70 after the etching step. As illustrated in FIG. 14, the pixel electrode is exposed because the metal layer 70 has been etched. In this step, the gate insulation film 12 itself that includes the contact hole 12a plays a role as a resist coat and accordingly the upper electrode 7 of the drain electrode 8 remains not etched as illustrated in FIG. 14. MoCr, the material for the metal layer 70, has a property of hardly passing through a light. However, by etching the metal layer 70 and exposing the pixel electrode 9, the light is allowed to pass through the region where the pixel electrode 9 is formed.

After the pixel electrode 9 has been exposed, the wet-etching step may be completed and the resist coat 131 may be removed. In this way, the TFT 1 (FIG. 1) can be manufactured.

In this embodiment, for the purpose of forming the source electrode 5, the drain electrode 8, the pixel electrode 9 and the source bus 10, some steps are performed in which the ITO film 50 is formed, the MoCr film 100 is formed on the ITO film 50 without etching the ITO 50, and both the MoCr film 100 and the ITO film 50 will be continuously etched using same resist coats 101 and 102 as described above in conjunction with FIG. 6 to FIG. 9. During these etching steps, the portion of the metal layer 70 corresponding to the contact hole 12a (refer to FIG. 14) has not been etched yet. However, this portion of the metal layer 70 can be etched as described above in conjunction with FIG. 14 since the gate insulation film 12 itself that contains the contact hole 12a serves as a resist coat, so that another particular resist coat may not be required for etching this portion of the metal layer 70. Accordingly, when etching the MoCr film 100 and the ITO film 50, it is not required to prepare two resist coats, one for etching the MoCr film 100 and the other for etching the ITO film 50. Thus, both the MoCr film 100 and the ITO film 50 could be etched in the desired patterns by using both the resist coats 101, 102 formed on the MoCr film 100 and the gate insulation film 12 containing the contact hole 12a. In other words, resist coats to be requested to define desired patterns in two kinds of metal films (i.e., the MoCr film 100 and the ITO film 50), are only resist coats 101 and 102 formed on the MoCr film 100. As a result, the manufacturing cost could be reduced.

Besides, the edge portion 5a of the source electrode 5 and the edge portion 6a of the lower electrode 6 are formed in taper shape as described above in conjunction with FIG. 9. Accordingly, the a-Si film 11 could be formed so as to gain a good step coverage at the edge portion 5a of the source electrode 5 and the edge portion 6a of the lower electrode 6 as illustrated in FIG. 10. As a result, a good ohmic contact could be obtained between the a-Si film 11 and the source electrode 5 and between the a-Si film 11 and the lower electrode 6 of the drain electrode 8 respectively.

Now, it is explained that, how the TFT manufacturing cost could be decreased by the inventive method as described above in conjunction with FIG. 1 to FIG. 14, in comparison with the conventional TFT manufacturing method.

Figure 15:
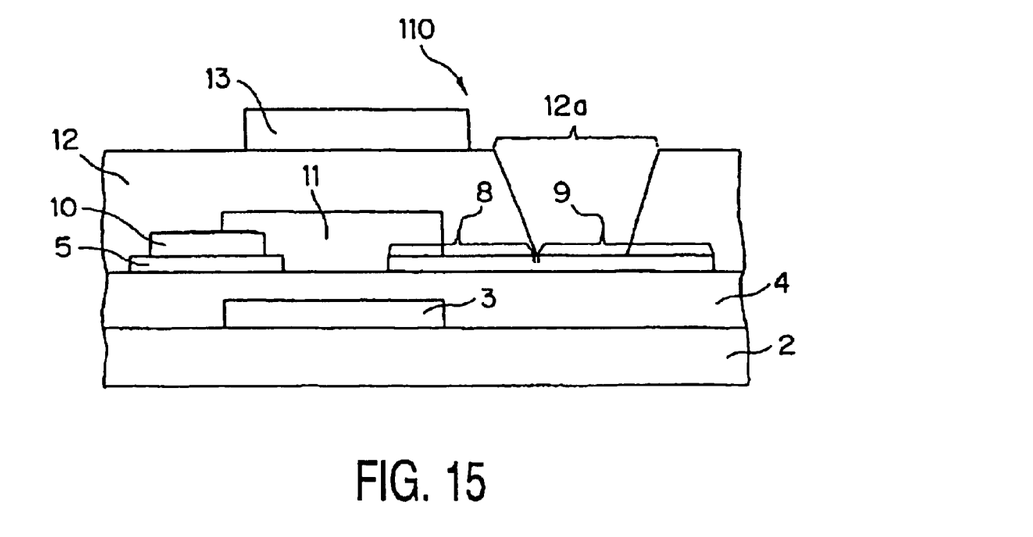
FIG. 15 is a schematic cross section of a TFT 110 that has been manufactured in accordance with the conventional manufacturing method.

FIG. 15 illustrates the cross sectional view of the TFT 110 that is produced by using a conventional manufacturing method. For this TFT 110, a light shield film 3, a $SiO_2$ film 4, a source electrode 5, a drain electrode 8, a pixel electrode 9, a source bus 10, an a-Si film 11, a gate insulator 12 and a gate electrode 13 are formed on a glass substrate 2. In order to form these films and electrodes on the glass substrate 2, it is required to perform lithography patterning processes six times; namely, one patterning process is required each for forming the light shield film 3, forming the source electrode 5, the drain electrode 8 and the pixel electrode 9, forming the source bus 10, forming the a-Si film 11, forming the contact hole 12a of the gate insulation electrode 12 and forming the gate electrode 13.

On the other hand, for the TFT 1 shown in FIG. 1, it is required to perform the lithography patterning processes only five times; namely, one patterning process is required each for forming the light shield film 3 (see FIG. 2), for forming the source electrode 5, the drain electrode 8, the pixel electrode 9 and the source bus 10 (see FIG. 6 to FIG. 9. It is noted that, after this process, the portion of the metal layer 70 corresponding to the contact hole 12a has not been etched), for forming the a-Si film 11 (see FIG. 10), for forming the contact hole 12 of the gate insulation film 12 (see FIG. 11) and for forming the gate electrode 13 (see FIG. 12 to FIG. 14. It is noted that, through the steps in FIG. 12 to FIG. 14, the portion of the metal layer 70 corresponding to the contact hole 12a is etched at the same time when the patterning process on the gate electrode 13 is performed). Accordingly, one patterning process could be saved by the inventive method associated with the TFT 1 shown in FIG. 1 in comparison with the conventional method associated with the TFT 110 shown in FIG. 15.

Figure 16:
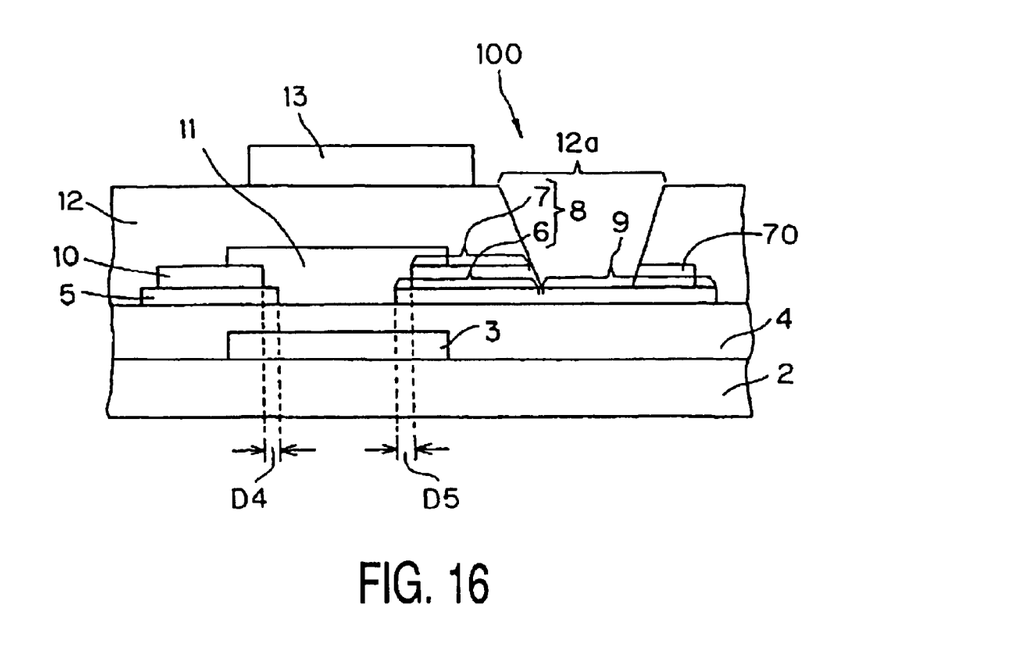
FIG. 16 is a schematic cross section of a TFT 100 that is a second embodiment of a semiconductor device of the invention and is manufactured using a second embodiment of a method of forming patterns of the invention.

FIG. 16 is a schematic cross section of a TFT 100 that is a second embodiment of a semiconductor device of the invention and is manufactured using a second embodiment of a method of forming patterns of the invention. In the following description of this TFT 100, FIGS. 16 to 19 will be primarily referenced but FIG. 2 to FIG. 14 may be also referenced as necessary. Besides, a method of manufacturing the TFT 100 shown in FIG. 16 will be explained by focusing on the differences between the method of manufacturing the TFT 100 shown in FIG. 16 and the TFT 1 shown in FIG. 1.

In order to produce the TFT 100, a light shield film 3, an $SiO_2$ layer 4, an ITO film 50 and an MoCr film 100 are firstly formed on the glass substrate 2 in accordance with the method as above described in conjunction with FIG. 2 to FIG. 5. Then, as illustrated in FIG. 6, resist coats 101 and 102 are formed on the MoCr film 100 and then the MoCr film 100 and the ITO film 50 are consecutively etched. In this embodiment, the MoCr film 100 is wet-etched and a the ITO film 50 is dry-etched.

Figure 17:
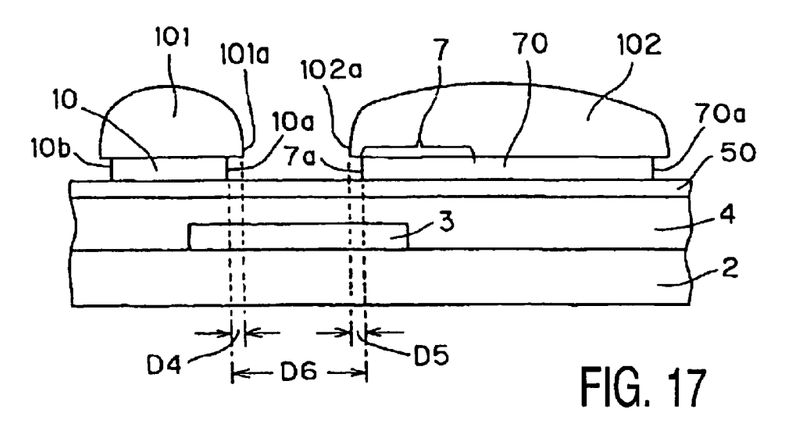
FIG. 17 is a schematic cross sectional view illustrating a state of having wet-etched the MoCr film 100.

FIG. 17 illustrates the state of the MoCr film after the wet-etching step. The MoCr film 100 is wet-etched using a mixed etchant of phosphoric acid, nitric acid and water. By performing this wet etching, a pattern of the source bus 10 can be formed just below the left-sided resist coat 101 whereas a pattern of the metal layer 70 is formed just below the right-sided resist coat 102. A part of the metal layer 70 constitutes an upper electrode of the drain electrode 8. The material for the metal layer 70 is the same MoCr as that for the source bus 10. Further, a side etching will be continued so that a distance D4 between an edge portion 101a of the resist coat 101 and an edge portion 10a of the source bus 10 and a distance D5 between an edge portion 102a of the resist coat 102 and an edge portion 7a of the upper electrode 7 might be about one micro millimeter. In addition, the edge portions 10a and 10b of the source bus 10, the edge portion 7a of the upper electrode 7 and an edge portion 70a of the metal film 70 can be formed substantially perpendicularly relative to the substrate 2. It should be noted that the MoCr film 100 can be etched using the mixed etchant of phosphoric acid, nitric acid and water but the ITO film 50 formed just below the MoCr film 100 can hardly be etched by the mixed etchant, so that the ITO film 50 may remain unchanged as illustrated in FIG. 17. Accordingly, after the MoCr film 100 has been wet-etched, the ITO 50 will be dry-etched.

Figure 18:
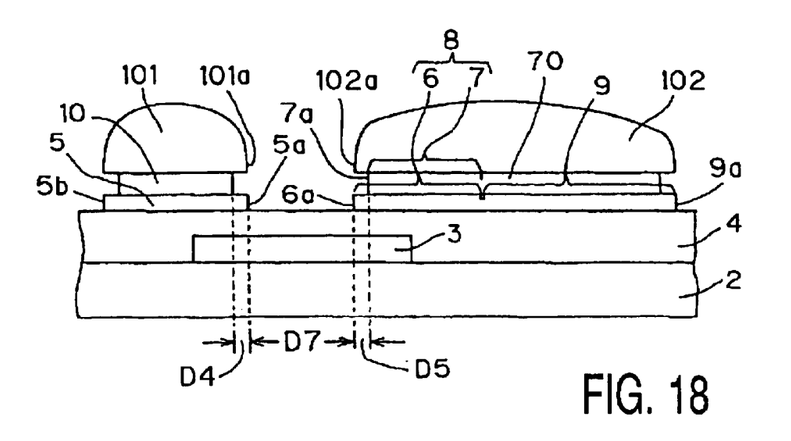
FIG. 18 is a schematic cross sectional view illustrating a state of having dry-etched the ITO film 50.

FIG. 18 illustrates a state of the ITO 50 after the dry-etching step. The ITO 50 is dry-etched using a high density PE method. $Cl_2$ is used as an etching gas. By dry-etching on the ITO 50, a pattern of the source electrode 5 can be formed just below the source bus 5 whereas patterns for the lower electrode 6 of the drain electrode 8 and the pixel electrode 9 can be formed just below the metal layer 70. In addition, the edge portions 5a and 5b of the source bus 5, the edge portion 6a of the lower electrode 6 and an edge portion 9a of the pixel electrode 9 can be formed substantially perpendicularly relative to the substrate 2. Besides, a side etching step is performed on the MoCr film 100 but a side etching step is not performed on the ITO 50. As a result of this, the edge portion 5a of the source electrode 5 may be substantially aligned on the edge portion 101a of the resist coat 101 and the edge portion 6a of the lower electrode 6 may be substantially aligned on the edge portion 102a of the resist coat 102. The distance D7 between the edge portion 5a of the source electrode 5 and the edge portion 6a of the lower electrode 6 is about 5 micro millimeters.

Figure 19:
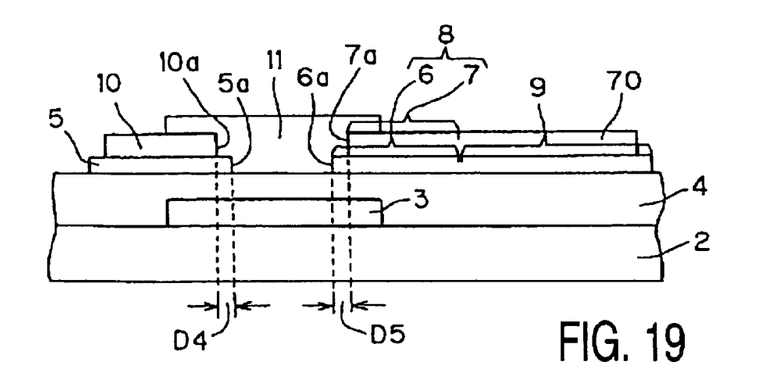
FIG. 19 is a schematic cross sectional view illustrating a state of having formed the island pattern of the a-Si film 11.

Resist coats 101 and 102 is removed after having formed the source bus 10, source electrode 5, the drain electrode 8 and the pixel electrode 9 as described above. Then, an island pattern of an a-Si film 11 can be formed as illustrated in FIG. 19. It should be noted that through the etching of the ITO 50, the edge portion 5a of the source electrode 5 protrudes relative to the edge portion 10a of the source bus 10 formed just above the source electrode 5 by a distance D4, the edge portion 6a of the lower electrode 6 of the drain electrode 8 protrudes relative to the edge portion 7a of the upper electrode 7 formed just above the lower electrode 6 by a distance D5, and the source electrode 5 and the lower electrode 6 are only about 400 angstrom thick. According to such structure of the respective protrusion of the edge portion 5a of the source electrode 5 and the edge portion 6a of the lower electrode 6 relative to the edge portion 10a of the source bus 10 and the edge portion 7a of the upper electrode 7 as well as such thickness (about 400 angstrom) of the source electrode 5 and the lower electrode 6, an good step coverage of the a-Si film 11 could be gained at the edge portion 5a of the source electrode 5 and the edge portion 6a of the lower electrode 6 without forming the edge portion 5a of the source electrode 5 and the edge portion 6a of the lower electrode 6 in taper shape. Accordingly, a good ohmic contact could be obtained between the a-Si film 11 and the source electrode 5 as well as between the a-Si film 11 and the lower electrode 6. Although the film thickness of the source electrode 5 and the lower electrode 6 is about 400 angstrom in this embodiment, any thickness more than 400 angstrom may be applied in terms of the good step coverage. However, too much thickness may be resulted in unfavorable step coverage. In general, no more than 500 angstrom may be in an acceptable range in terms of good step coverage.

After having formed the a-Si film 11, a gate insulation film 12 containing a contact hole 12a and a gate electrode 13 will be formed in the same manner with that explained above in conjunction with FIG. 11 to FIG. 14. When forming the gate electrode 13, the Al film 130 is etched until the pixel electrode 9 may be exposed. Through these steps, the TFT 100 shown in FIG. 16 can be produced.

During the manufacturing process for the TFT 100, in order to form the source electrode 5, the drain electrode 8, the pixel electrode 9 and the source bus 10, some steps are performed in which the ITO film 50 is formed, the MoCr film 100 is formed on the ITO 50 without etching the ITO film 50, and both the MoCr film 100 and the ITO 50 are etched by using the common resist coats 101 and 102 as described above in conjunction with FIG. 17 and FIG. 18. During the steps as illustrated in FIG. 17 and FIG. 18, the portion of the metal layer 70 corresponding to the contact hole 12a has not been etched yet. However, this portion of the metal layer 70 can be etched as described above in conjunction with FIG. 14 since the gate insulation film 12 itself that contains the contact hole 12a serves as a resist coat, so that another particular resist coat may not be required for etching this portion of the metal layer 70. Accordingly, resist coats to be requested to define desired patterns in two kinds of metal films (i.e., the MoCr film 100 and the ITO film 50) are only resist coats 101 and 102 formed on the MoCr film 100 just as the TFT 1 shown in FIG. 1. As a result, the cost reduction can be achieved.

Furthermore, in the second embodiment, the edge portions 10a and 10b of the source bus 10, the edge portion 7a of the upper electrode 7 and an edge portion 70a of the metal film 70 are formed substantially perpendicularly relative to the substrate 2 and also the edge portions 5a and 5b of the source electrode 5, the edge portion 6a of the lower electrode 6 and an edge portion 9a of the pixel electrode 9 are formed substantially perpendicularly relative to the substrate 2. However, these edge portions may be formed in taper shape according to the adjusted etching condition.

Now, here is another TFT, which is the third embodiment of the inventive semiconductor device that may be produced by using the third embodiment of the inventive method for forming patterns. The TFT in the third embodiment has the same structure with the TFT 100 in the second embodiment as illustrated in FIG. 16. Therefore, the structure of the TFT in the third embodiment will be explained in conjunction with FIG. 16. Besides, the manufacturing method for the TFT in the third embodiment will be explained in conjunction with FIG. 20 and FIG. 21 as well as FIG. 2 to FIG. 19 as necessary.

In order to produce the TFT 100 in the third embodiment, a light shield film 3, an $SiO_2$ layer 4, an ITO film 50 and an MoCr film 100 are firstly formed on the glass substrate 2 in accordance with the method as above described in conjunction with FIG. 2 to FIG. 5. Then, after forming resist coats 101 and 102 on the MoCr film 100, the MoCr film 100 and the ITO film 50 are etched as illustrated in FIG. 6. The etching steps will be described in conjunction with FIG. 17, FIG. 20 and FIG. 21. Firstly, the MoCr film 100 can be etched as illustrated in FIG. 17, and as a result a source bus 10 and a metal layer 70 can be formed. A portion of the metal layer 70 constructs the upper electrode 7 of the drain electrode 8. In this embodiment, the distance D4 between an edge portion 101a of the resist coat 101 and an edge portion 10a of the source bus 10 and the distance D5 between an edge portion 102a of the resist coat 102 and an edge portion 7a of the upper electrode 7 are about 0.5 micro millimeters, and also the distance D6 between the edge portion 10a of the source bus 10 and the edge portion 7a of the upper electrode 7 is about 5 micro millimeters. After the wet-etching on the MoCr film 100, another wet-etching will be performed on the ITO film 50.

Figure 20:
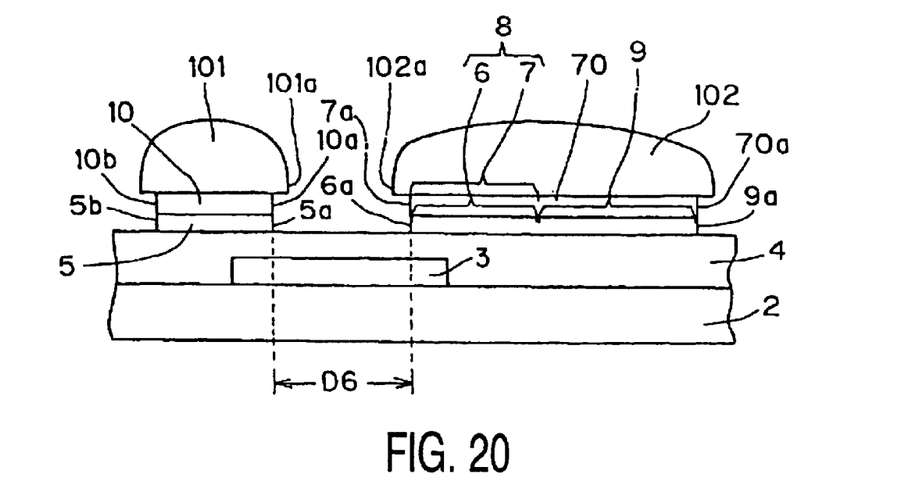
FIG. 20 is a schematic cross sectional view illustrating a state of having illustrating a state of having wet-etched the ITO film 50.

FIG. 20 illustrates a state of the ITO film 50 after such wet-etching. This wet-etching step for the ITO 50 may use HCl (hydrochloric acid) as an etchant. As a result of the etching for the ITO 50, the edge portions 5a and 5b of the source electrode 5 are substantially aligned with the edge portions 10a and 10b of the source bus 10, and the edge portion 6a of the lower electrode 6 and the edge portion 9a of the pixel electrode 9 are substantially aligned with the edge portion 7a of the upper electrode 7 and the edge portion 70a of the metal layer 70, respectively.

After having etched the MoCr film 100 and the ITO film 50, a further wet-etching step is performed on the edge portions 10a and 10b of the source bus 10, the edge portion 7b of the upper electrode 7 and the edge portion 70a of the metal layer 70.

Figure 21:
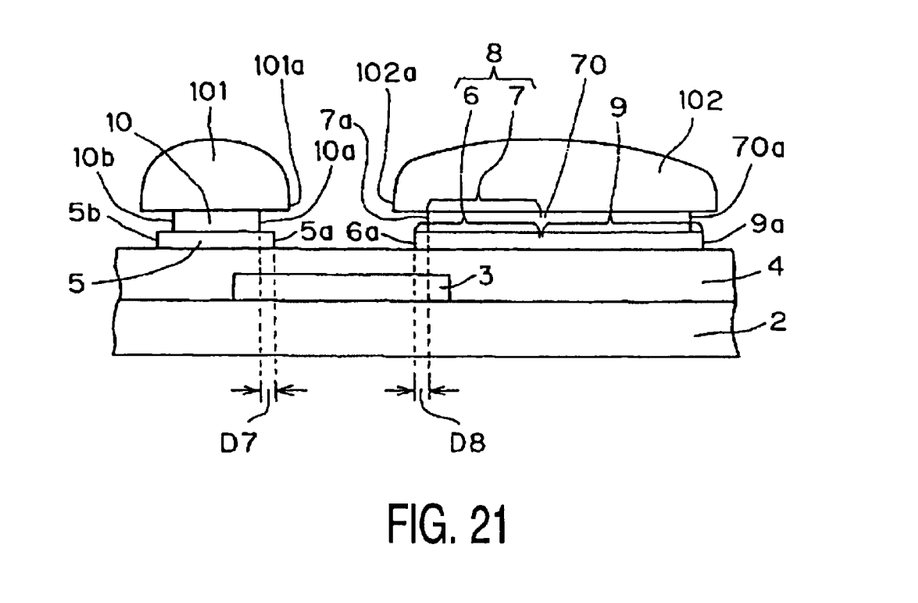
FIG. 21 is a schematic cross sectional view illustrating a state of having wet-etched the edge portions 10a and 10b of the source bus 10 and the edge portion 70a and 70b of the upper electrode 70.

FIG. 21 illustrates a state after the further wet-etching is performed on the edge portions 10a and 10b of the source bus 10, the edge portion 7b of the upper electrode 7 and the edge portion 70a of the metal layer 70. In this wet-etching step, a side-etching is performed using the mixed etchant of phosphoric acid, nitric acid and water so that the distance D7 between the edge portion 10a of the source bus 10 and the edge portion 5a of the source electrode 5 and the distance D8 between the edge portion 7a of the upper electrode 7 and the edge portion 6a of the lower electrode 6 might be kept about 1.0 micro millimeter.

Thus, patterning processes on the MoCr film 100 and the ITO film 50 are performed. Then, an island pattern of the a-Si film 11 will be formed as illustrated in FIG. 19. Again, it should be noted that the edge portion 5a of the source electrode 5 protrudes relative to the edge portion 10a of the source bus 10 formed just above the source electrode 5 by a distance D4 (=D7), the edge portion 6a of the lower electrode 6 protrudes relative to the edge portion 7a of the upper electrode 7 formed just above the lower electrode 6 by a distance D5 (=D8), and the source electrode 5 and the lower electrode 6 are formed so as to be only about 400 angstrom thick. Accordingly, a good step coverage of the a-Si film 11 could be gained at the edge portion 5a of the source electrode 5 and the edge portion 6a of the lower electrode 6 without forming the edge portion 5a of the source electrode 5 and the edge portion 6a of the lower electrode 6 in taper shape, just as in the case of TFT of the second embodiment. Thus, a good ohmic contact could be obtained between the a-Si film 11 and the source electrode 5 as well as between the a-Si film 11 and the lower electrode 6. Although the film thickness of the source electrode 5 and the lower electrode 6 is about 400 angstrom in this embodiment, any thickness more than 400 angstrom may be applied in terms of the good step coverage. However, too much thickness may be resulted in unfavorable step coverage. In general, thickness of no more than 500 angstrom may be preferable in terms of good step coverage.

After having formed the a-Si film 11, a gate insulation film 12 containing a contact hole 12a as well as a gate electrode 13 will be formed by using the method as above described in conjunction with FIG. 11 to FIG. 14. In forming the gate electrode 13, the Al film 130 is etched until the lower electrode 6 may be exposed. Thus, the TFT 100 in the third embodiment can be produced.

During the manufacturing process for the TFT 100 in the third embodiment, in order to form the source electrode 5, the drain electrode 8, the pixel electrode 9 and the source bus 10, some steps are performed in which the ITO film 50 is formed, the MoCr film 100 is formed on the ITO 50 without etching the ITO film 50, and the MoCr film 100 and the ITO 50 are etched by using the common resist coats 101 and 102 as described above in conjunction with FIG. 17, FIG. 20 and FIG. 21. During the steps as illustrated in FIG. 17, FIG. 20 and FIG. 21, the portion of the metal layer 70 corresponding to the contact hole 12a has not been etched yet. However, this portion of the metal layer 70 can be etched as described above in conjunction with FIG. 14 since the gate insulation film 12 itself that contains the contact hole 12a serves as a resist coat, so that another particular resist coat may not be required for etching this portion of the metal layer 70. Accordingly, the cost reduction can be achieved just as in the case with the TFT of the first and second embodiments.

In the above-described embodiments as illustrated in FIG. 1 to FIG. 21, the pixel electrode 9 is formed in addition to the source electrode 5, the drain electrode 8 and the source bus 10 by etching the layered film consisting of the MoCr film 100 and the ITO film 50. However, the invention may be applied to produce such semiconductor devices without any pixel electrode as transistors mounted on a circuit arrangement (e.g., IC).

Besides, in the above-described embodiments as illustrated in FIG. 1 to FIG. 21, for the purpose of forming the source electrode, the drain electrode and the source bus, a layered metal film is formed which consists of the ITO film 50 and the MoCr film 100 formed on the ITO film 50. However, any other layered metal film without the ITO film 50 and MoCr film 100 may be formed, depending on the type of the semiconductor device to be produced.

Furthermore, in the above-described embodiments as illustrated in FIG. 1 to FIG. 21, for the purpose of etching the layered metal film consisting of the ITO film 50 and MoCr film 100, resist coats 101 and 102 are formed directly on the surface of the layered metal film. However, depending on the type of the semiconductor device to be produced, some steps may be possible in which any other one or more films than resist coat are formed on the layered metal film after forming the layered metal film and before forming some resist coats, and then some resist coats are formed on such one or more films. Even if any other one or more films than resist coats are formed on the metal layer, not only the one or more films but also the layered metal film could be etched by forming resist coats on the surface of such one or more films.

Besides, in the above-described embodiments as illustrated in FIG. 1 to FIG. 21, examples of the TFT manufacturing process using the first, second and third embodiments of this invention are presented. However, the method of forming patterns according to the present invention could be applied to produce any other semiconductor devices than the TFT.

Furthermore, the semiconductor device and the method of forming patterns in accordance with the invention should not be limited to the above-described embodiments, and various modifications and changes to those embodiments may be possible in accordance with specific applications and manufacturing conditions of the semiconductor device.

As described above, according to the invention, it is advantageously possible to obtain the method of forming patterns and the semiconductor device in which the manufacturing cost of semiconductor devices can be reduced and the improved step coverage can be realized.

What is claimed is:

1. A semiconductor device, comprising:
   a source electrode formed on a substrate;
   a source bus formed on said source electrode; and
   a drain electrode that is formed on said substrate and includes a first electrode and a second electrode formed on said first electrode,
   wherein an edge portion of said source electrode protrudes toward said drain electrode relative to an edge portion of said source bus and an edge portion of said first electrode of said drain electrode protrudes toward said source electrode relative to said second electrode.

2. The semiconductor device of claim 1, wherein each edge portion of said source electrode, said source bus, said first electrode and said second electrode is formed into a surface that is perpendicular to said substrate.

3. The semiconductor device of claim 1, wherein each edge portion of said source electrode, said source bus, said first electrode and said second electrode, is formed into a surface that is inclined relative to said substrate.

* * * * *